US006929957B2

(12) United States Patent
Min et al.

(10) Patent No.: US 6,929,957 B2
(45) Date of Patent: Aug. 16, 2005

(54) MAGNETIC RANDOM ACCESS MEMORY DESIGNS WITH PATTERNED AND STABILIZED MAGNETIC SHIELDS

(75) Inventors: Tai Min, San Jose, CA (US); Po Kang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 91 days.

(21) Appl. No.: 10/661,039

(22) Filed: Sep. 12, 2003

(65) Prior Publication Data

US 2005/0059170 A1 Mar. 17, 2005

(51) Int. Cl.⁷ .............................................. H01L 21/00
(52) U.S. Cl. ........................... 438/3; 438/595; 438/737
(58) Field of Search .............................. 438/3, 5, 595, 438/647, 737, 982

(56) References Cited

U.S. PATENT DOCUMENTS

| | | | |
|---|---|---|---|
| 5,650,958 A | 7/1997 | Gallagher et al. | 365/173 |
| 5,757,695 A | 5/1998 | Shi et al. | 365/158 |
| 5,841,692 A | 11/1998 | Gallagher et al. | 365/173 |
| 5,917,749 A | 6/1999 | Chen et al. | 365/173 |
| 5,959,880 A | 9/1999 | Shi et al. | 365/158 |
| 6,005,800 A | 12/1999 | Koch et al. | 365/173 |
| 6,166,948 A | 12/2000 | Parkin et al. | 365/173 |
| 6,219,212 B1 | 4/2001 | Gill et al. | 360/324.2 |
| 6,242,770 B1 | 6/2001 | Bronner et al. | 257/295 |
| 6,750,540 B2 * | 6/2004 | Kim | 257/741 |
| 6,815,783 B2 * | 11/2004 | Kim et al. | 257/421 |

* cited by examiner

*Primary Examiner*—Phuc T. Dang
(74) *Attorney, Agent, or Firm*—George D. Saile; Stephen B. Ackerman

(57) ABSTRACT

A magnetic tunneling junction (MTJ) memory cell and an MRAM array of such cells, is shielded by magnetic shields of ferromagnetic material or by ferromagnetic shields that are stabilized by patterned layers of antiferromagnetic material or permanent magnetic material. The ferromagnetic portions of the shields surround the MTJ cells substantially conformally and thereby can compensate the poles of the free layers of MTJ cells of various geometric cross-sectional shapes and also protect the cells from the adverse effects of extraneous fields. The additional antiferromagnetic and permanent magnetic materials stabilize the shields by exchange or direct coupling.

87 Claims, 5 Drawing Sheets

MAGNETIC RANDOM ACCESS MEMORY DESIGNS WITH PATTERNED AND STABILIZED MAGNETIC SHIELDS

BACKGROUND OF THE INVENTION

1. Field of the Invention

This invention relates to the use of magnetic tunnel junctions (MTJ) as storage elements (cells) in non-volatile magnetic memory cell arrays (MRAM). In particular it relates to MRAM arrays of shielded MTJ cells in which the cells have their uncompensated edge poles eliminated by magnetostatic coupling to magnetic shields and, in addition, are shielded from each other and from extraneous external magnetic fields by various forms and configurations of said shields.

2. Description of the Related Art

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, depending on the orientation of the spin of the tunneling electrons relative to the magnetization direction of the ferromagnetic layers. Thus, if these magnetization directions are varied, the tunneling current will also vary as a function of the relative directions for a given applied voltage. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel or antiparallel configurations (writing) and that these two configurations can be sensed by tunneling current variations or resistance variations (reading). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines (or word lines and sense lines). When both lines are activated, the device is written upon, ie, its magnetization direction is changed. When only one line is activated, the resistance of the device can be sensed, so the device is effectively read. In this regard, Bronner et al. (U.S. Pat. No. 6,242,770 B1) teaches a method for forming thin film conductors as word and bit lines so that the MTJ device is in close proximity to a lower line and a diode is located below that line.

In order for the MTJ MRAM device to be competitive with other forms of DRAM, it is necessary that the MTJ be made very small, typically of sub-micron dimension. Parkin et al. (U. S. Pat. No. 6,166,948) notes that sub-micron dimensions are needed to be competitive with DRAM memories in the range of 10–100 Mbit capacities. Parkin also notes that such small sizes are associated with significant problems, particularly super-paramagnetism, which is the spontaneous thermal fluctuation of magnetization produced by in samples of ferromagnetic material too small to have sufficient magnetic anisotropy (a measure of the ability of a sample to maintain a given magnetization direction). Another size-related problem results from non-uniform and uncontrollable edge-fields produced by shape-anisotropy (a property of non-circular samples). These edge fields result in a large degree from randomly oriented magnetization vectors that form at the edges of the MTJ cells. These orientations have a tendency to curl back towards the magnetization vector of the body of the cell in an effort to minimize the magnetic energy of the cell. Such edge effects are also associated with uncompensated magnetic poles that form at the cell edges. As the cell size decreases, these edge fields become relatively more important than the magnetization of the body of the cell and have an adverse effect on the storage and reading of data. Although such shape-anisotropies, when of sufficient magnitude, reduce the disadvantageous effects of super-paramagnetism, they have the negative effect of requiring high currents to change the magnetization direction of the MTJ for the purpose of storing data. To counteract these edge effects, Shi et al. (U.S. Pat. No. 5,757,695) teaches the formation of an ellipsoidal MTJ cell wherein the magnetization vectors are aligned along the length (major axis) of the cell and which do not present variously oriented edge domains, high fields and poles at the ends of the element.

MTJ devices have been fabricated in several configurations, one type comprising a free ferromagnetic layer separated from a fixed (or pinned) layer. In such a configuration, the MTJ has data stored in it by causing the magnetization of its free layer to be either parallel or antiparallel to that of the pinned layer. The pinned layer may itself be a composite layer formed of two ferromagnetic layers held in an antiparallel magnetization configuration by some form of magnetic coupling so that it presents a zero or negligible net magnetic moment to the MTJ. Such an arrangement is advantageous in reducing edge effects due to anisotropies. Parkin, cited above, teaches an improved MTJ cell utilizing a free layer that comprises two ferromagnetic layers that are coupled by their dipolar fields in an antiparallel magnetization configuration to produce a small, but non-zero, magnetic moment. When written on by an external applied magnetic field, the two magnetic moments switch directions simultaneously so that the net magnetic moment of the free layer switches direction relative to the pinned layer. In addition, Gallagher et al. (U.S. Pat. No. 5,650,958) teaches the formation of an MTJ device suitable for use in an MRAM array wherein the device comprises a free ferromagnetic layer and a pinned ferromagnetic layer which is pinned by interfacial exchange with an antiferromagnetic layer. Gallagher et al. (U.S. Pat. No. 5,841,692) also teaches the formation of an MTJ device having free and fixed layers wherein the fixed layer is formed as a sandwich of antiferromagnetically coupled ferromagnetic layers. Further, Shi et al. (U.S. Pat. No. 5,959,880) teach the formation of a low aspect ratio MTJ device in which two layers of magnetoresistive material are separated by electrically insulating material.

It is undesirable for MTJ devices to have excessive magnetic coupling between adjacent magnetic layers of neighboring devices or even within the same device as this coupling must be overcome when writing on the device. As noted above, edge anisotropies are one source of undesirable coupling. Koch et al. (U.S. Pat. No. 6,005,800) deal with the problem that results when writing to one specific cell also affects the magnetization directions of adjacent cells that are not being addressed. Koch teaches the formation of cells with two shapes, which are mirror images of each other. The cells are arranged in a checkerboard pattern, so that a cell of one shape is surrounded by cells of the other shape. Since neighboring cells thereby have their preferred magnetization vectors oriented differently, there is a reduced probability that writing to one cell type will affect the magnetization of the other type.

As has been discussed, many of the problems associated with the construction of MRAM arrays are related to the shapes of the cells. Cell shapes of present designs are typically single element rectangle, elliptical or lozenge. Chen et al. (U.S. Pat. No. 5,917,749) provides a rectangular multi-layered MTJ cell comprising two rectangular magnetic layers magnetized in parallel directions along an easy axis corresponding to a direction of magnetic anisotropy and separated by a non-magnetic layer.

Any irregularities of these shapes, defects at their edges produced during their formation, or uncompensated poles of variable strength, will result in coercivity fluctuations distributed throughout the array. It is the object of the present invention to control the problem of undesirable edge effects and non-uniform array coercivity more effectively than is done in the prior art by providing magnetic shields between arrangements of cells within an MRAM array. These shields serve several purposes, including providing pole compensation for edge poles of cell elements, shielding cells from the effects of external magnetic fields and shielding the magnetizations of individual cells from the effects of nearby cells. The use of shields to partially surround MTJ cells is not unknown in the prior art. Gill et al. (U.S. Pat. No. 6,219,212 B1) provide an MTJ device for use as an MRAM cell or as a magnetic field sensor in a magnetic disk drive, in which magnetic material layers disposed above and below the MTJ device. The shields also act as current leads for the MTJ device. It is evident from the topology of the shielding layers that they are not intended to shield one such MTJ device from coplanar adjacent MTJ devices. Furthermore, it is also evident from the shield topology that they are not intended to cancel uncompensated poles formed at the edges of the magnetic free layer of the MTJ device.

SUMMARY OF THE INVENTION

A first object of this invention is to provide an MRAM array of MTJ cells wherein said devices are magnetically shielded from each other and from extraneous external magnetic fields.

A second object of this invention is to provide an MRAM array of shielded MTJ cells whose magnetization switching properties are insensitive to shape irregularities and edge defects.

A third object of this invention is to provide an MRAM array of shielded MTJ cells, in which array coercivity variations and resulting switching field variations due to shape irregularities and edge defects in the MTJ devices is eliminated or greatly reduced.

A fourth object of this invention is to provide an MRAM array of shielded MTJ cells in which problems of write selectivity, ie, writing onto unintended array locations, is eliminated or greatly reduced.

A fifth object of this invention is to provide an MRAM array of shielded MTJ cells which is less dependent on the shape of individual cell elements for its performance.

A sixth object of the present invention is to provide an MRAM array of shielded MTJ cells whose switching properties are uniform at all points of the array.

A seventh object of the present invention is to provide an MRAM array of shielded MTJ cells in which the threshold for switching is reduced.

An eighth object of the present invention is to provide an MRAM array of shielded MTJ cells meeting the above objects and in which the MTJ cells are densely deployed within the array.

These objects will be achieved by an MRAM array of shielded MTJ cells in which the shields compensate the free ferromagnetic layer of each MTJ cell at the edges of said cell. Additionally, said shields will also protect each MTJ cell in the MRAM array from the influence of extraneous external fields and from the undesirable influence of the fields produced by other MTJ cells in the array. The MTJ cell layers, insulating layers and shield layers are formed by methods of ion-beam deposition or chemical vapor deposition processes which are well known in the art. The shields are formed of ferromagnetic alloys and are patterned by the use of a photolithographic stencil and ion-beam milling subsequent to the formation and patterning of the cell array using the same stencil. The shields are thereby self aligned to the cell array and are shaped to conformally fit the individual MTJ cells. The shield will be electrically isolated from each memory cell by the formation of an insulating layer deposited prior to the shield formation. In accord with the objects of the invention, the uncompensated poles at the edges of the MTJ cells will be magnetostatically coupled to the shields so as to reduce the curling of magnetization and the formation of randomly oriented edge domains. The crystalline anisotropy of the shields can be set to be perpendicular to the crystalline anisotropy defining the easy axes of the MTJ cells. This will ensure that the shields and the cells are magnetized perpendicularly to each other. Such setting of crystalline anisotropy is produced by methods well known in the art, including the deposition of layers in appropriate magnetic fields. This mutual orthogonality of magnetization will enhance the magnetostatic coupling between the cells and the shields leading to more effective pole compensation. It is to be noted that the presence of uncompensated poles is highly disadvantageous because such poles constitute a high energy state of the cell. To minimize its energy, the cell will tend to produce magnetization curling by forming unstable, randomly oriented edge domains in the vicinity of the poles. These randomly oriented, unstable and uncontrollable domain states serve as nucleation sites for state switching (nucleation sites being positions at which there is the onset of a magnetization change). Because the domains are randomly oriented, the state switching is non-uniform and leads to disadvantageous variations of switching thresholds and coercivity across the MRAM array. The shields provided by the present invention will prevent the formation of randomly oriented edge domains by serving as pole compensation mechanisms that eliminate the formation of such edge domains by providing an alternative mechanism for reducing the energy of the configuration. Further, the elimination of randomly oriented edge domains allows a uniformity of switching fields for the MRAM array. To insure that the magnetic shields themselves remain free of undesirable domain formations, the present invention also provides the additional formation of antiferromagnetic or permanent magnetic layers formed contiguously to the shields and maintaining them free of edge domains and stabilizing their magnetization.

The MRAM array is preferably formed of an array of MTJ cell configurations formed on a substrate in which cell-accessing conductive lines may already be present. Each cell preferably comprises a ferromagnetic free layer separated by an insulating tunneling junction layer from a fixed layer which is a magnetostatically coupled multilayer with zero magnetic moment comprising a first ferromagnetic layer having a first magnetization direction, a non-magnetic coupling layer, a second ferromagnetic layer having a second magnetization direction opposite to the first direction and an antiferromagnetic layer which pins the ferromagnetic layers of the fixed layer in their mutually antiparallel configuration. The configuration thus formed can then be patterned by a process of photolithography and ion milling well known in the art. Subsequent to the patterning, an insulating layer is formed surrounding the MTJ cells and, subsequent to that, the ferromagnetic magnetic shields are formed conformally surrounding the MTJ cells, with their directions of magnetic anisotropy formed orthogonal to that of the MTJ cells. Finally, additional layers of permanent magnetic material can be formed adjacent to the shield layers to provide additional magnetic field stabilization of the shields. The cells in the array may be forther covered by an insulating layer and additional conducting accessing lines may be formed above them.

DESCRIPTION OF THE PREFERRED EMBODIMENT

The preferred embodiment of the present invention teaches a method of forming a shielded MRAM array of MTJ cells, said cells being substantially surrounded by and electrically insulated from a formation of ferromagnetic magnetic shields which conform to the shape of the MTJ cells and which may be stabilized by the formation of additional layers of antiferromagnetic and permanent magnetic materials. The magnetic shields compensate magnetic poles which would ordinarily form at the edges of the MTJ cells and shield the cells from undesired magnetic fields.

Referring first to FIGS. 1a–1d, there is shown schematic overhead diagrams of an array of elliptical MTJ cells (20) surrounded by different shield (30) and gap (40) patterns. Any of these designs would meet the objects of the present invention and it is clear that other patterns may be equally appropriate if they satisfy the design criteria. The choice of MTJ cells which are substantially identical in their size and elliptical horizontal cross-section is for purposes of the example only and it is to be expected that substantially identical individual cells of a wide variety of isolated geometric horizontal cross-sectional shapes and sizes would be equally satisfactory as would cells composed of chains of discrete segments of a variety of shapes and sizes. Shields can be formed of the same ferromagnetic material as the ferromagnetic layers of the MTJ cells in the array, or they can be formed of different ferromagnetic materials. The material chosen, however, must be of sufficient magnetic softness (low coercivity) to allow magnetostatic coupling between the edges of the MTJ cells and the shields. The easy axis of the shield can be set by shape anisotropy or, preferentially, by crystalline anisotropy to be substantially perpendicular to the easy axis magnetization of the MTJ cells. This arrangement will enhance the magnetostatic coupling between the cells and the shields. It is also noted that the effectiveness of coupling between the shields and the MTJ cells requires that the shields at least partially conformally surround the cells. The conforming of the shield openings to the shape of the cell is provided in the present invention by a photolithographic and ion-milling process of the shields wherein the photolithographic stencil is formed around the photolithographic stencil already used to shape the cells. The process of forming such stencils and of ion-milling using said stencils as ion-milling masks is well known in the art and is not described herein.

Figure 1A:
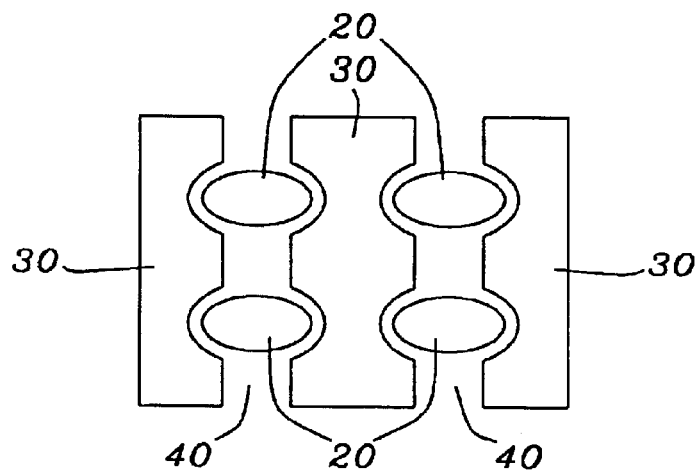
FIGS. 1a–d are schematic illustrations of several different shield designs conformally patterned for elliptical MTJ cells.
Figure 1B:
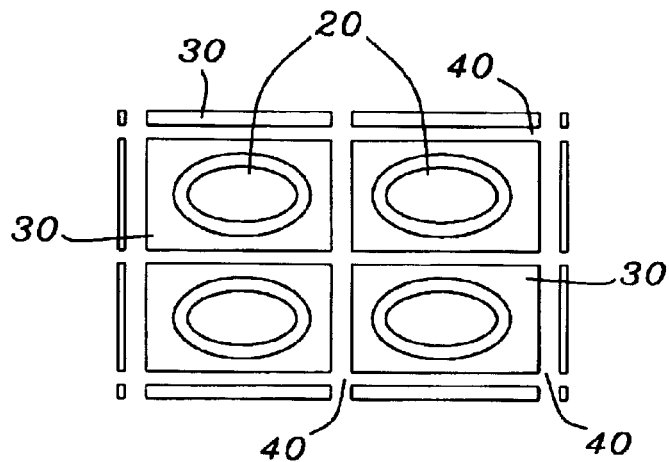
Figure 1C:
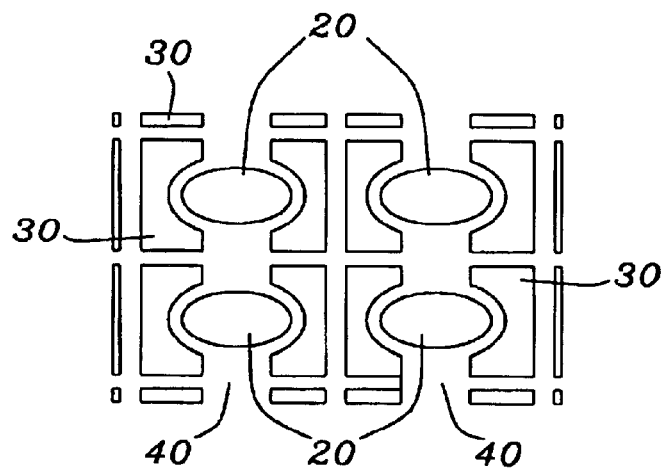
Figure 1D:
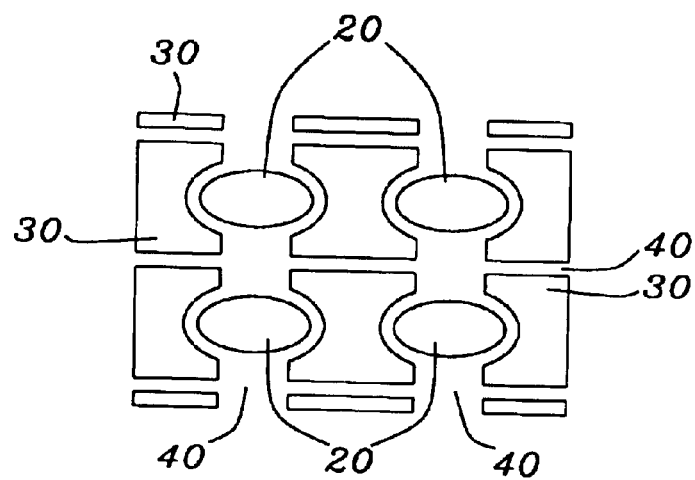
Figure 2A:
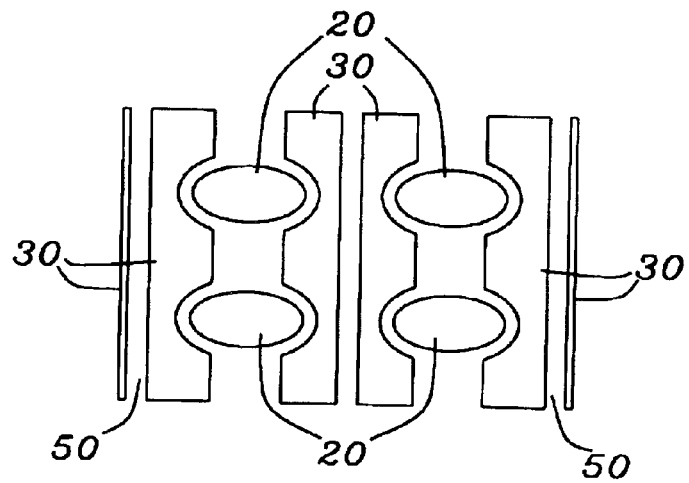
FIGS 2a–c are schematic illustrations of shield designs stabilized by antiferromagnetic or permanent magnetic layers.
Figure 2B:
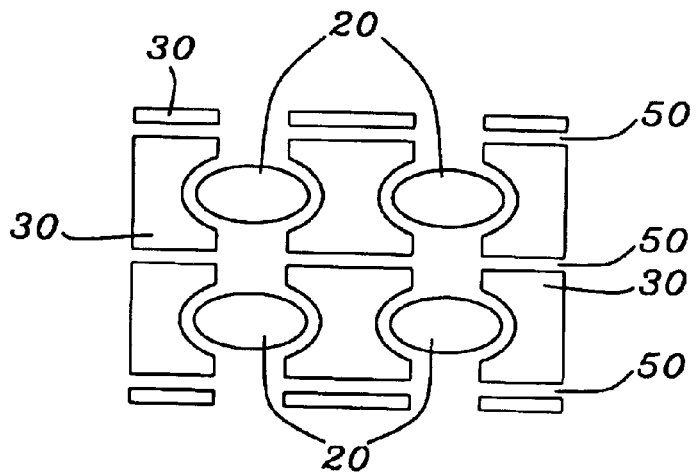
Figure 2C:
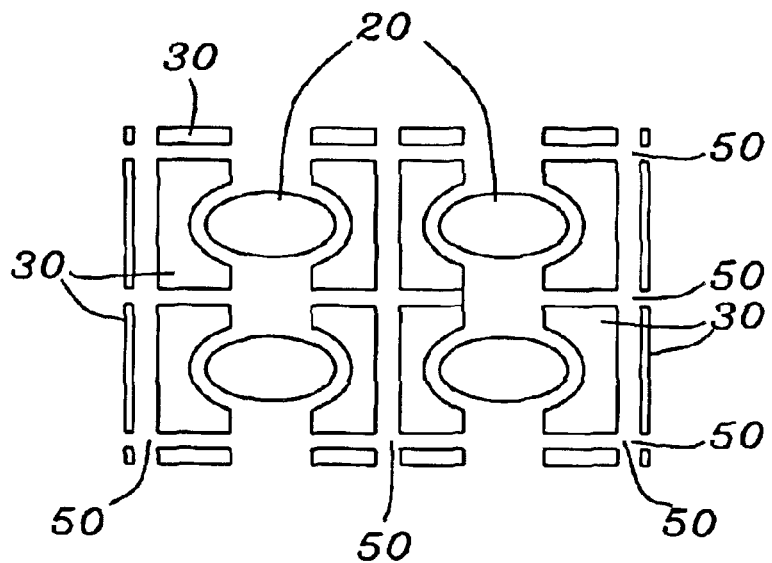

Referring next to FIGS. 2a–c, there is shown schematic overhead diagrams of shielded MRAM arrays in which additional contiguous layers of stabilizing magnetic material (50) have been added in variously patterned configurations around the ferromagnetic shield material (30) which is shown partially surrounding four MTJ cells (20). An exposed gap region of insulation is also shown (40). The stabilizing material can be antiferromagnetic material, such as PtMn, NiMn, IrMn, OsMn, PdPtMn, NiO, CoO or CoNiO which exchange couples to the ferromagnetic shield portion or permanent magnetic material, such as Co, CoCr, CoCrPt, CoPt, CoCrB, CoPtB, CoP or CoNiFe, which directly couples to the ferromagnetic portion. Either material will accomplish the desired object of eliminating magnetic domains within the ferromagnetic shields (30) and thereby stabilizing the coupling between the ferromagnetic shields and the memory cells (20). FIG. 2a shows a strip (50) of either antiferromagnetic or permanent magnetic material formed along the bottom edge of the ferromagnetic shield (30). FIG. 2b shows three such strips (50) formed horizontally through the ferromagnetic shield (30). FIG. 2c shows three vertical strips (50) passing through the ferromagnetic strips (30).

Figure 3A:
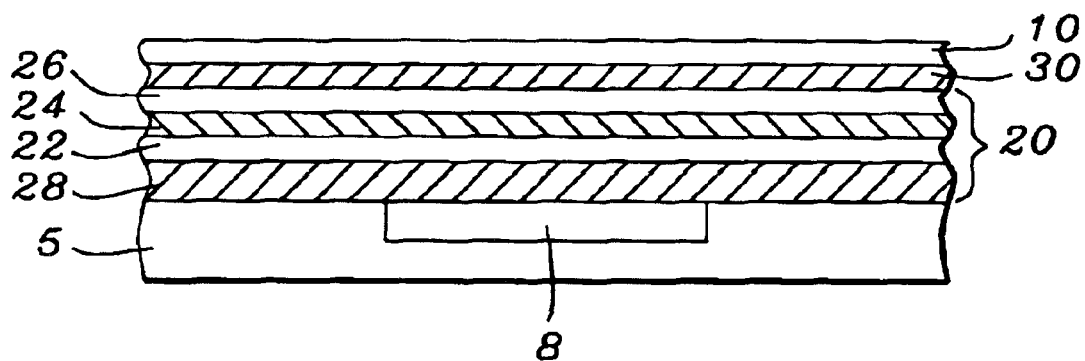
FIGS. 3a–e show a cross-sectional schematic illustration of the formation of a multi-layered MTJ cell surrounded by insulating layers and shield layers.

Referring to FIG. 3a, there is shown a cross-sectional view of a multilayered MTJ structure designed to efficiently achieve the objects of the present invention subsequent to it being patterned to form an array. A brief summary of the MTJ structure formation is discussed below.

The MTJ structure is formed on a substrate (5) within which conducting lines (8) may already have been formed to contact the underside of the MTJ structure. The MTJ structure is formed of a ferromagnetic free layer (10), which may be a multilayer, separated by an insulating tunneling layer (30) from a magnetically pinned layer (20). It is understood that the crystalline anisotropy directions of the free and pinned ferromagnetic layers may be set in preferred directions during the formation of those layers so that the easy axis of magnetization is along that direction. In this preferred embodiment, the crystalline anisotropy direction will be the same in all ferromagnetic layers although the final directions of the magnetization may be parallel or antiparallel to that direction.

The pinned layer (20) is a multilayer, comprising a first ferromagnetic layer (22) and a second ferromagnetic layer (26) separated by a coupling layer (24) formed of non-magnetic coupling materials such as Rh, Ru, Cr or Cu formed to a thickness between approximately 5 and 50 angstroms. The magnetizations of the first and second ferromagnetic layers are exchange coupled in antiparallel directions across the coupling layer of properly chosen thickness and the magnetization of the second ferromagnetic layer is pinned by an antiferromagnetic layer (28) such as a layer of PtMn, NiMn, OsMn, IrMn, NiO or CoNiO, positioned adjacent to the second ferromagnetic layer and formed to a thickness between approximately 30 and 300 angstroms. The material composition and thicknesses of the first and second ferromagnetic layers are chosen so that their magnetizations are essentially equal in magnitude. Thus, when they are fixed in opposite directions, the net magnetic moment of the pinned layer is substantially zero. In the preferred embodiments herein, the materials of these pinned layers as well as the free layers are ferromagnetic materials such as NiFe, CoFe, CoNiFe, CoFeB, CoZrB, CoHfB, FeN and they are formed to a thickness between approximately 5 and 500 angstroms. It may be advantageous to also form the ferromagnetic free layer as a multilayer comprising two ferromagnetic layers coupled with their magnetizations in an antiparallel configuration across a non-magnetic layer of either Rh, Ru, Cr, or Cu, in a manner similar to the formation of the pinned layer, with the caveat that the net magnetic moment should not be zero, since the free layer must be switched by the word line field.

Figure 3B:
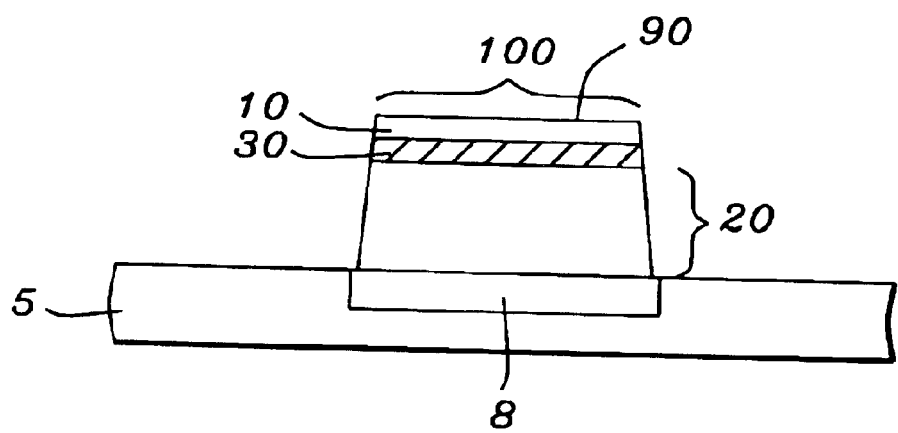

Referring next to FIG. 3b, there is shown the structure of FIG. 3a now formed into a cell having a top (90) and sides (92). The cell will be formed with a certain horizontal cross-sectional shape in accord with the objects of the present invention using photolithographic and ion-milling methods in which a photolithographic stencil shaped in accord with the desired shape of the MTJ cell is formed on the structure and the stencil then is used as a photolithographic mask for producing the required geometric shape by ion-milling. Since such processes are well know to those skilled in the art, they are not described further herein. It has also been noted above that the photolithographic stencil for the cell shape is allowed to remain for purposes of self aligning a subsequent photolithographic stencil to be used in forming the magnetic shields. This process is also well known in the art and is not described herein.

The cell shape can be any of a wide variety of isolated geometrical forms such as ellipses, lozenges, notched geometric forms, forms having the narrowest dimension at their middle, or chains which are multiple discrete segments of such forms. To be consistent with the illustrations of FIGS. 1 and 2, the horizontal cross-sectional shape will be considered as being elliptical. FIG. 3b shows only one elliptical segment, (100) and, since it is seen in profile, the fact that it is elliptical is not evident. It is further understood that in forming an array of such cells, the multilayered structure of FIG. 3a would be shaped by a single photolithographic and ion-milling process into an array of cells substantially identical to the single cell indicated in this figure.

Figure 3C:
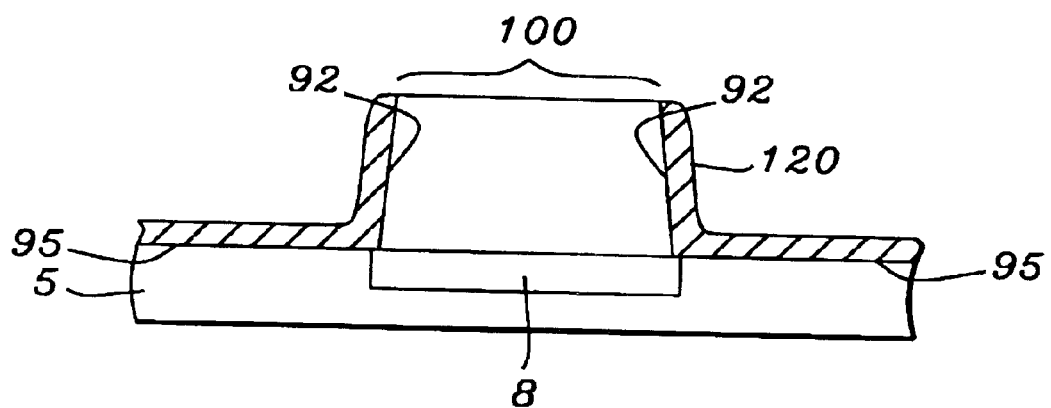

Referring next to FIG. 3c, there is shown the cell of FIG. 3b, (100), whereon an insulating layer (120) has been formed conformally (contacting contiguously) over the sides of the cell (92) and overlaying at least a portion of the substrate surrounding the cell (95). If an array of cells is being formed, the insulating layer would be formed conformally covering the sides of all cells in the array and the exposed substrate surfaces surrounding them. The insulating layer would preferably be a layer of dielectric material such as $Al_2O_3$, $HaO_2$, $ZrO_2$ or $SiO_2$, formed to a thickness between approximately 100 and 1000 angstroms. Depending upon the size of the array and the shape of its elements, the insulation deposition may be done in a single step or as a series of steps.

Figure 3D:
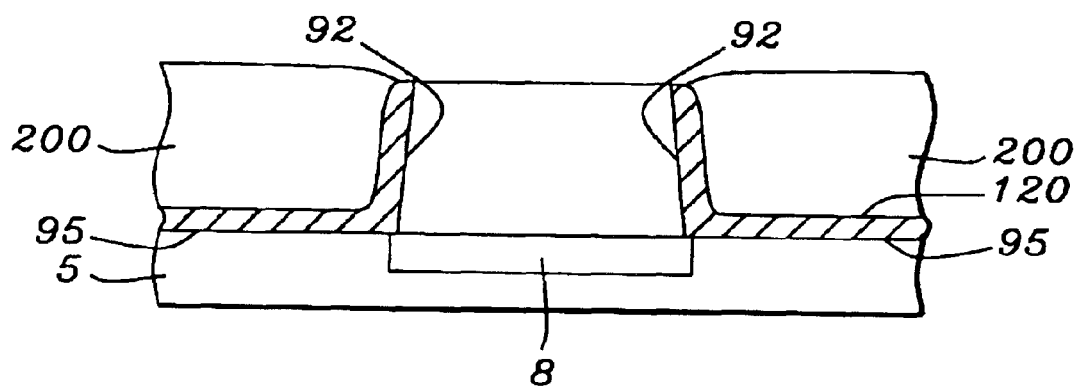

Referring next to FIG. 3d, there is shown the cell (100) of FIG. 3c subsequent to the formation of a magnetic shield layer (200) over the insulation layer (120), said shield layer conformally surrounding the cell by uniformly contacting and abutting the insulation layer on the sides of the cell (92). The formation of the shields can be most advantageously accomplished by a self-aligned process in which the photolithographic stencil used for forming the cell array is not removed after cell array formation, but remains and is also used to form the insulation layer and the shield. The stencil is removed subsequent to the entire process. Such processes are well known in the art and are not illustrated herein.

The shields may then be formed of the same ferromagnetic material as is used to form the ferromagnetic layers of the cell or of other soft (low coercivity) ferromagnetic material. A shield of CoFe formed to a thickness of between approximately 10 and 1000 angstroms would be preferred, but materials such as NiFe, CoFe, CoNiFe, CoFeB, CoZrB, CoHfB, FeN, which can also be used to form the ferromagnetic layers of the MTJ cell, are also appropriate when formed to thicknesses between approximately 10 and 1000 angstroms. In the process of forming the shields, the crystalline anisotropy of the shield can be controlled and set in various directions relative to the crystalline anisotropy of the free ferromagnetic layers of the MTJ cells by forming the shield in the presence of an approximately 30–60 Oe field in the desired anisotropy direction. A direction of shield anisotropy that is orthogonal to that of the MTJ cells and a subsequent magnetization of the shields which is also orthogonal to that of the MTJ cells is preferable and is found to maximize and stabilize magnetostatic coupling between the cells and the shields. The shield formation process also allows control of the coercivity of the shield material and a coercivity in the range between 0 and 200 Oe is preferable.

Figure 3E:
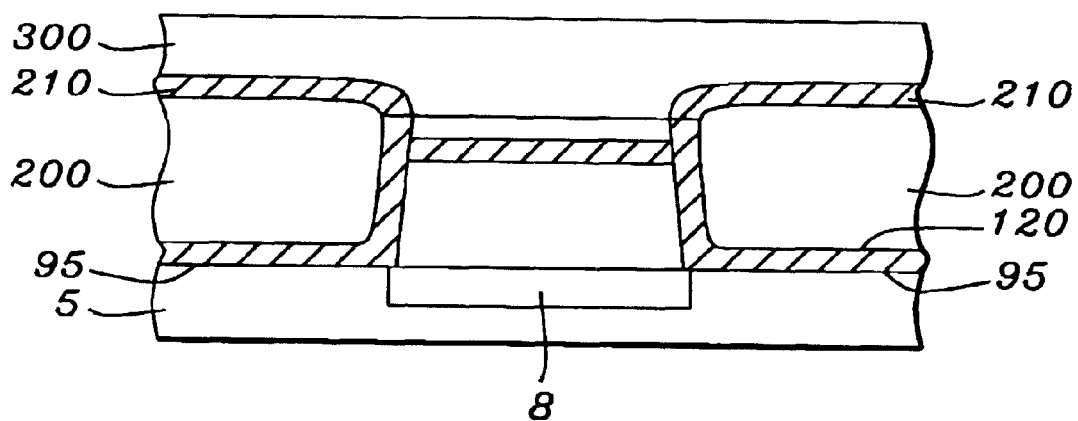

Referring next to FIG. 3e, there is shown the formation of an additional insulating layer (210) over the magnetic shield and the formation of an additional conducting layer (300) over the insulated shield and contacting the upper surface of the MTJ cell. The overlaying conducting layer (300) will be patterned so that together with the conducting word lines (8) already formed (typically, separately from the cell array) within the substrate, reading and writing on the cell will be allowed and, in particular, reading and writing on selected cells of the array will be allowed. It is noted that methods of forming word lines within the substrate on which the MTJ cell array is formed are well known in the prior art and are not described herein.

It is understood that to achieve the objects of the invention the formation of the shields can include the patterning of regions within which stabilizing layers of antiferromagnetic or permanent magnetic materials can be formed in accord with the illustrations in FIGS. 2a–c. The formation of such additional layers requires an additional patterning process for the shields and the use of the same patterning stencil to produce a self-aligned formation of the permanent magnetic layers adjacent to the shields. The magnetization of the permanent magnetic layer is then set perpendicularly to the magnetization of the MTJ cell. An antiferromagnetic layer, if used, is deposited on top of the shields to obtain the required exchange coupling.

As is understood by a person skilled in the art, the preferred embodiment of the present invention is illustrative of the present invention rather than being limiting of the present invention. Revisions and modifications may be made to methods, processes, materials, structures, and dimensions through which is formed an MRAM array of shielded MTJ cells, while still providing an MRAM array of shielded MTJ cells formed in accord with the present invention as defined by the appended claims.

What is claimed is:

1. A magnetically shielded magnetic tunnel junction (MTJ) cell, comprising:
   a substrate;
   a magnetic tunnel junction (MTJ) cell formed on the substrate, said cell having a top and sides and the horizontal cross-section of said cell having a certain geometric shape;
   a first layer of insulation formed conformally over the sides of said cell and at least a portion of the substrate surrounding said cell;
   a layer of magnetically shielding material formed covering the portion of said insulation on the substrate and abutting the portion of said insulation on the sides of said cell, said shielding material being thereby electrically insulated from said cell and said substrate by said insulation; and
   a second layer of insulation formed over the magnetic shield, said layer not contacting the top of the MTJ cell; and
   said MTJ cell having a first first magnetization direction; and
   said shielding material having a second magnetization direction; and
   the magnetization of said MTJ cell being maintained by magnetostatic coupling to said magnetically shielding material.

2. The shielded MTJ cell of claim 1 wherein said cell is shaped by a process comprising photolithography and ion-milling in which a photolithographic stencil of the required cell shape is first formed on an unshaped cell and said stencil is then used as an ion-milling mask to produce said geometric shape.

3. The shielded MTJ cell of claim 1 wherein the shape of said cell is chosen from the group of shapes consisting of circles, ellipses, lozenge shapes, complex geometrical shapes and multi-segmented chains of such shapes.

4. The shielded MTJ cell of claim 3 wherein the shape is an ellipse.

5. The shielded MTJ cell of claim 1 wherein the insulating layer is a layer of dielectric material chosen from the group consisting of $Al_2O_3$, $HaO_2$, $ZrO_2$ and $SiO_2$ and said layer is formed to a thickness of between approximately 50 and 500 angstroms.

6. The shielded MTJ cell of claim 1 wherein the shielding layer is formed by a photolithographic process utilizing the same stencil used for forming said cell and whereby said shielding layer is self-aligned with said MTJ cell.

7. The shielded MTJ cell of claim 1 wherein the shielding layer is a layer of ferromagnetic material chosen from the group consisting of NiFe, CoFe, CoNiFe, CoFeB, CoZrB, CoHfB and FeN and wherein said layers have been provided with a crystalline anisotropy direction and a co-linear magnetic easy axis.

8. The shielded MTJ cell of claim 7 wherein the shielding layer is a layer of CoFe formed to a thickness between approximately 10 and 1000 angstroms.

9. The shielded MTJ cell of claim 1 wherein said cell comprises:
   a ferromagnetic free layer having a first crystalline anisotropy direction;
   an insulating tunneling layer formed on said free layer;
   a pinned magnetic layer formed on said tunneling layer, said pinned layer further comprising:
      a first ferromagnetic pinned layer having a second crystalline anisotropy direction;
      a non-magnetic coupling layer formed on said first ferromagnetic pinned layer;
      a second ferromagnetic pinned layer formed on said coupling layer said second ferromagnetic layer having a third crystalline anisotropy direction;
      an antiferromagnetic pinning layer formed on said second ferromagnetic pinned layer and pinning its magnetization; and
   the first, second and third anisotropy directions being co-linear; and
   said first and second ferromagnetic pinned layers being magnetically coupled by direct coupling in antiparallel directions along said anisotropy direction; and
   the total magnetic moment of said first and second ferromagnetic pinned layers being substantially zero.

10. The cell of claim 9 wherein the cell cross-sectional shape is characterized by a long axis and a short axis and the crystalline anisotropy direction is along the long axis.

11. The cell of claim 9 wherein the three ferromagnetic layers are formed of the group of ferromagnetic materials consisting of of CoFe, NiFe, CoNiFe, CoZrTa, CoFeB, CoZrTa, CoNbTa and CoHfTa to a thickness of between approximately 5 and 500 angstroms.

12. The cell of claim 9 wherein the coupling layer is a layer of non-magnetic coupling material chosen from the group consisting of Rh, Ru, Cr and Cu and is formed to a thickness between approximately 5 and 50 angstroms.

13. The cell of claim 12 wherein the coupling layer thickness is chosen to provide exchange coupling between said first and second ferromagnetic pinned layers.

14. The cell of claim 9 wherein the antiferromagnetic pinning layer is a layer of antiferromagnetic material chosen from the group consisting of PtMn, NiMn, OsMn, IrMn, NiO and CoNiO and said layer is formed to a thickness between approximately 30 and 300 angstroms.

15. The cell of claim 9 wherein the ferromagnetic free layer is a multilayer having a non-zero magnetization comprising two ferromagnetic layers having oppositely directed magnetizations separated by a non-magnetic coupling layer that allows magnetostatic coupling between said ferromagnetic layers.

16. The shielded MTJ cell of claim 1 wherein the first magnetization direction of the MTJ cell and the second magnetization direction of the shield are substantially orthogonal.

17. The shielded MTJ cell of claim 1 wherein the shield has a coercivity between approximately 0 and 200 Oe.

18. The shielded MTJ cell of claim 1 wherein a first conducting layer is formed within said substrate beneath said MTJ cell and said layer contacts the MTJ cell.

19. The shielded MTJ cell of claim 16 further comprising a second conducting layer formed on said layer of insulation, said conducting layer contacting the top of said MTJ cell.

20. An array of shielded MTJ cells comprising:
   a substrate;
   a plurality of MTJ cells disposed in a uniform array on said substrate, each MTJ cell having a top and sides and a horizontal cross-section of a given geometrical shape;
   an insulating layer formed on the substrate and also covering the sides of said MTJ cells;
   a patterned magnetic shield formed over the insulating layer on the substrate, said shield conformally abutting and contacting at least a portion of the insulating layer on the side of each MTJ cell;

a second layer of insulation formed over the magnetic shield, said layer not contacting the top of the MTJ cell; and said magnetic shield is electrically insulated from said substrate and from each MTJ cell; and each MTJ cell is magnetized in a first direction; and said magnetic shield is magnetized in a second direction; and each MTJ cell is magnetostatically coupled to said magnetic shield.

21. The array of shielded MTJ cells of claim 20 wherein each said cell is shaped by a process comprising photolithography and ion-milling in which a photolithographic stencil of the required cell shape is first formed on an unshaped cell and said stencil is then used as an ion-milling mask to produce said geometric shape.

22. The array of shielded MTJ cells of claim 21 wherein the magnetic shield is formed and patterned using said photolithographic stencil, whereby said shield is self-aligned with said MTJ cells.

23. The array of shielded MTJ cells of claim 22 wherein a crystalline anisotropy direction of the shield is determined during its formation by placing said shield in an external magnetic field between approximately 30 and 60 Oe in said direction and whereby there is produced an easy axis in a direction of preferred magnetization.

24. The array of shielded MTJ cells of claim 23 wherein the direction of magnetization of the shield and the direction of magnetization of the MTJ cell are substantially orthogonal.

25. The array of shielded MTJ cells of claim 24 wherein the shielding layer is a layer of ferromagnetic material chosen from the group consisting of CoFe, NiFe, CoNiFe, CoZrTa, CoFeB, CoZrTa, CoNbTa and CoHfTa and said layer is formed to a thickness between approximately 10 and 1000 angstroms.

26. The array of shielded MTJ cell of claim 25 wherein the shielding layer is a layer of CoFe.

27. The array of shielded MTJ cells of claim 24 wherein the horizontal cross-sectional shape is chosen from the group of shapes including ellipses, rectangles, lozenges, notched geometric shapes, shapes having their narrowest dimension at their middles, segmented shapes, chains of circles and other regular and irregular geometric shapes.

28. The array of shielded MTJ cells of claim 27 wherein the horizontal cross-sectional shape of each cell has a long axis and a short axis, wherein said axes are mutually orthogonal and wherein said cells form rows of uniformly separated cells in which their major axes are co-linear and columns of uniformly separated cells in which their minor axes are co-linear and define, thereby, an orthogonal rectangular array whose first and second array axes extend co-linearly along said short and long axes respectively.

29. The array of shielded MTJ cells of claim 28 wherein the horizontal cross-sectional shape is an ellipse.

30. The array of shielded MTJ cells of claim 26 wherein the coercivity of the shield is between approximately 0 and 200 Oe.

31. The array of shielded MTJ cells of claim 28 wherein said shield is patterned to form continuous, substantially rectangular strips whose long edge is parallel to said first array axis, said strips being separated along the direction of said second array axis by substantially rectangular gaps also parallel to said first array axis, the mid-lines of said gaps passing through the centers of the MTJ cells aligned in columns along said first array axis and said gaps being narrower than the major axis of the cells so that horizontally disposed end portions of said cells extend into, are conformally surrounded by, but are electrically insulated from, separated portions of said shield disposed across the gap from each other.

32. The array of shielded MTJ cells of claim 31 further comprising parallel, uniformly separated gaps extending along the direction of the second array axis, the mid-line of said gaps passing midway between said MTJ cells.

33. The array of shielded MTJ cells of claim 32 further comprising parallel, uniformly separated gaps extending along the direction of the first array axis and passing between opposite edges of adjacent MTJ cells.

34. The array of shielded MTJ cells of claim 16 further comprising a second conducting layer formed on said layer of insulation, said conducting layer contacting the top of said MTJ cell.

35. The array of shielded MTJ cells of claim 20 wherein each said MTJ cell comprises:

a ferromagnetic free layer having a first crystalline anisotropy direction;

an insulating tunneling layer formed on said free layer;

a pinned magnetic layer formed on said tunneling layer, said pinned layer further comprising:
  a first ferromagnetic pinned layer having a second crystalline anisotropy direction;
  a non-magnetic coupling layer formed on said first ferromagnetic pinned layer;
  a second ferromagnetic pinned layer formed on said coupling layer said second ferromagnetic layer having a third crystalline anisotropy direction;
  an antiferromagnetic pinning layer formed on said second ferromagnetic pinned layer and pinning its magnetization; and the first, second and third anisotropy directions being co-linear; and said first and second ferromagnetic pinned layers being magnetically coupled by direct coupling in antiparallel directions along said anisotropy direction; and the total magnetic moment of said first and second ferromagnetic pinned layers being substantially zero.

36. An array of MTJ cells shielded by a stabilized magnetic shield comprising:

a substrate;

a plurality of MTJ cells disposed in a uniform array on said substrate, each MTJ cell having a top and sides and a horizontal cross-section of a given geometrical shape;

an insulating layer formed on the substrate and also covering the sides of said MTJ cells;

a patterned stabilized magnetic shield formed over the insulating layer on the substrate, said shield having a first patterned portion and a second patterned portion, wherein said first patterned portion conformally abuts and contacts at least a portion of the insulating layer on the side of each MTJ cell;

a second layer of insulation formed over the magnetic shield, said layer not contacting the tops of said MTJ cells; and both portions of said magnetic shield are electrically insulated from said substrate and from each MTJ cell; and each MTJ cell is magnetized in a first direction; and the first portion of said magnetic shield is magnetized in a second direction substantially orthogonal to the first direction; and each MTJ cell is magnetostatically coupled to said first portion of the magnetic shield; and the second portion of said magnetic shield stabilizes the magnetization of said first portion by a form of magnetic coupling.

37. The array of MTJ cells of claim 36 wherein each said cell is shaped by a process comprising photolithography and ion-milling in which a photolithographic stencil of the required cell shape is first formed and said stencil is then used as an ion-milling mask to produce said geometric shape.

38. The array of MTJ cells of claim 37 wherein both said portions of said magnetic shield are formed and patterned using a self-aligned process of photolithography and ion-milling wherein the photolithographic stencil for said shield is aligned with the photolithographic stencil for the MTJ cells.

39. The array of MTJ cells of claim 38 wherein the horizontal cross-sectional shape of each cell has a long axis and a short axis, wherein said axes are mutually orthogonal and wherein said cells form rows of uniformly separated cells in which their major axes are co-linear and columns of uniformly separated cells in which their minor axes are co-linear and define, thereby, an orthogonal rectangular array whose first and second array axes extend co-linearly along said short and long axes respectively.

40. The array of MTJ cells of claim 39 wherein said first portion is patterned to form continuous, substantially rectangular strips of equal length and width, whose upper and lower edges are co-linear along said second array axis and whose long edge is parallel to said first array axis, said strips being separated along the direction of said second array axis by substantially rectangular gaps also parallel to said first array axis, the mid-lines of said gaps passing through the centers of the MTJ cells aligned in columns along said first array axis and said gaps being narrower than the major axis of the cells so that horizontally disposed end portions of said cells extend into, are conformally surrounded by, but are electrically insulated from, separated portions of said shield disposed across the gap from each other and wherein said second portion of the shield is formed as two horizontal rectangular strips extending in the second array axis direction and contacting the upper and lower edges of said first portion of the shields.

41. The array of MTJ cells of claim 40 wherein said first portion of the shield is further patterned by the formation of parallel, uniformly spaced gaps extending in the direction of said second array axis, the mid-line of said gaps passing midway between the centers of the MTJ cells aligned in rows along said first array axis and wherein said second portion of the shield further comprises rectangular strips of magnetic material formed within said gaps formed in the second array axis direction.

42. The array of MTJ cells of claim 41 wherein said first portion of the shield is further patterned by the formation of a second set of parallel, uniformly spaced gaps extending in the direction of said first array axis, the mid-line of said second set of gaps passing midway between the centers of the MTJ cells aligned in columns along said first array axis and wherein said second portion of the shield further comprises rectangular strips of magnetic material formed within said second set of gaps formed in the first array axis direction.

43. The array of MTJ cells of claim 40 wherein said first portion of the shield is patterned to form rectangular segments, the long sides of said segments being parallel to the first array axis and the short sides being parallel to the second array axis, the segments being formed by and their sides being bounded by continuous gaps extending in the direction of said first and second array axis, and wherein each rectangular segment contains at least one MTJ cell and wherein said second portion of the shield comprises strips of magnetic material formed in said gaps.

44. The array of MTJ cells of claim 40 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

45. The array of MTJ cells of claim 41 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

46. The array of MTJ cells of claim 42 wherein said patterned first portion is formed of ferromagnetic material chosen from the group consisting of CoFe, CoFeNi— and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

47. The array of MTJ cells of claim 43 wherein said patterned first portion is formed of ferromagnetic material chosen from the group consisting of CoFe, CoFeNi— and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

48. The array of MTJ cells of claim 40 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

49. The array of MTJ cells of claim 41 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

50. The array of MTJ cells of claim 42 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

51. The array of MTJ cells of claim 43 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

52. The array of MTJ cells of claim 36 wherein each said MTJ cell comprises:
- a ferromagnetic free layer having a first crystalline anisotropy direction;
- an insulating tunneling layer formed on said free layer;
- a pinned magnetic layer formed on said tunneling layer, said pinned layer further comprising:
    - a first ferromagnetic pinned layer having a second crystalline anisotropy direction;
    - a non-magnetic coupling layer formed on said first ferromagnetic pinned layer;
    - a second ferromagnetic pinned layer formed on said coupling layer said second ferromagnetic layer having a third crystalline anisotropy direction;
    - an antiferromagnetic pinning layer formed on said second ferromagnetic pinned layer and pinning its magnetization; and
- the first, second and third anisotropy directions being co-linear; and
- said first and second ferromagnetic pinned layers being magnetically coupled by direct coupling in antiparallel directions along said anisotropy direction; and
- the total magnetic moment of said first and second ferromagnetic pinned layers being substantially zero.

53. A method of forming a magnetically shielded magnetic tunnel junction (MTJ) cell, comprising:
- providing a substrate;
- forming a magnetic tunnel junction (MTJ) cell on the substrate, said cell having a top and sides and the horizontal cross-section of said cell having a certain geometric shape;
- forming a layer of insulation conformally over the sides of said cell and at least a portion of the substrate surrounding said cell;
- forming a layer of magnetically shielding material covering the portion of said insulation on the substrate and abutting the portion of said insulation on the sides of said cell, said shielding material being thereby electrically insulated from said cell and said substrate by said insulation;
- forming a second layer of insulation over said magnetically shielding material, said second layer not contacting the top of said MTJ cell; and
- magnetizing said cell along a first direction; and
- magnetizing said shielding material along a second direction; and
- maintaining the magnetization of said cell by magnetostatic coupling to said magnetically shielding material.

54. The method of claim 53 wherein said cell is shaped by a process comprising photolithography and ion-milling in which a photolithographic stencil of the required cell shape is first formed and said stencil is then used as an ion-milling mask to produce the geometric shape.

55. The method of claim 54 wherein said geometric shape of said cell is chosen from the group of shapes consisting of circles, ellipses, lozenge shapes, complex geometrical shapes and multi-segmented chains of such shapes.

56. The method of claim 54 wherein the shielding layer is formed by a self aligned photolithographic process, wherein the photolithographic stencil used in the shaping of said cell is also used in the formation and patterning of said shield.

57. The method of claim 53 wherein the formation of said MTJ cell comprises:
- forming a ferromagnetic free layer having a first crystalline anisotropy direction;
- forming an insulating tunneling layer on said free layer;
- forming a pinned magnetic layer on said tunneling layer, said pinned layer formation further comprising:
    - forming a first ferromagnetic pinned layer having a second crystalline anisotropy direction;
    - forming a non-magnetic coupling layer on said first ferromagnetic pinned layer;
    - forming a second ferromagnetic pinned layer on said coupling layer said second ferromagnetic layer having a third crystalline anisotropy direction;
    - forming an antiferromagnetic pinning layer on said second ferromagnetic pinned layer and, thereby, pinning its magnetization; and the first, second and third anisotropy directions being co-linear; and said first and second ferromagnetic pinned layers being magnetically coupled by direct coupling in antiparallel directions along said anisotropy direction; and
- the total magnetic moment of said first and second ferromagnetic pinned layers being substantially zero.

58. The method of claim 57 wherein the cell cross-sectional shape is characterized by a long axis and a short axis and the crystalline anisotropy direction is along the long axis.

59. The method of claim 57 wherein the non-magnetic coupling layer thickness is chosen to provide direct magnetostatic coupling between said first and second ferromagnetic pinned layers.

60. The method of claim 53 wherein the first magnetization direction of the MTJ cell and the second magnetization direction of the shield are substantially orthogonal.

61. The method of claim 60 wherein the coercivity of the shield is between approximately 0 and 200 Oe.

62. A method for forming an array of shielded MTJ cells comprising:
- providing a substrate;
- disposing a plurality of MTJ cells in a uniform array on said substrate, each MTJ cell having a top and sides and a horizontal cross-section of a given geometrical shape;
- forming an insulating layer on the substrate and the sides of said MTJ cells;
- forming a patterned magnetic shield over the insulating layer on the substrate, said shield conformally abutting and contacting at least a portion of the insulating layer on the side of each MTJ cell;
- forming a layer of insulation over the magnetic shield, said layer not contacting the top of said MTJ cells;
- wherein said magnetic shield is electrically insulated from said substrate and from each MTJ cell; and
- wherein each MTJ cell is magnetized in a first direction; and
- wherein said magnetic shield is magnetized in a second direction; and
- wherein each MTJ cell is magnetostatically coupled to said magnetic shield.

63. The method of claim 62 wherein said cell is shaped by a process comprising photolithography and ion-milling in which a photolithographic stencil of the required cell shape is first formed and said stencil is then used as an ion-milling mask to produce said geometric shape.

64. The method of claim 63 wherein the magnetic shield is formed and patterned using a self-aligned process of photolithography and ion-milling wherein the photolithographic stencil for the shield is aligned with the photolithographic stencil for the MTJ cells.

65. The method of claim 64 wherein a crystalline anisotropy of the shield is determined during its formation and aligned to form an easy axis of magnetization in a direction of preferred magnetization by forming said shield in an external magnetic field of between approximately 30 and 60 Oe and directed along said direction of preferred magnetization.

66. The method of claim 62 wherein the direction of magnetization of the shield and the direction of magnetization of the MTJ cell are substantially orthogonal.

67. The method of claim 63 wherein the horizontal cross-sectional shape is chosen from the group of shapes including ellipses, rectangles, lozenges, notched geometric shapes, geometric shapes whose minimum dimension is in their middle, segmented shapes, chains of circles and other regular and irregular geometric shapes.

68. The method of claim 67 wherein the horizontal cross-sectional shape of each cell has a long axis and a short axis, wherein said axes are mutually orthogonal and wherein said cells form rows of uniformly separated cells in which their major axes are co-linear and columns of uniformly separated cells in which their minor axes are co-linear and define, thereby, an orthogonal rectangular array whose first and second array axes extend co-linearly along said short and long axes respectively.

69. The method of claim 68 wherein said shield is patterned to form continuous, substantially rectangular strips of equal length and width, whose shorter edges are aligned co-linearly with said second array axis and whose long edge is parallel to said first array axis, said strips being separated along the direction of said second array axis by substantially rectangular gaps also parallel to said first array axis, the mid-lines of said gaps passing through the centers of the MTJ cells aligned in columns along said first array axis and said gaps being narrower than the major axis of the cells so that horizontally disposed end portions of said cells extend into, are conformally surrounded by, but are electrically insulated from, separated portions of said shield disposed across the gap from each other.

70. The method of claim 69 wherein said shield is patterned to further comprise parallel, uniformly separated gaps extending along the direction of the second array axis, the mid-line of said gaps passing midway between said MTJ cells.

71. The method of claim 69 wherein said shield is patterned to further comprise parallel, uniformly separated gaps extending along the direction of the first array axis and passing between opposite edges of adjacent MTJ cells.

72. A method of forming an array of MTJ cells shielded by stabilized magnetic shields comprising:
providing a substrate;
forming on said substrate a plurality of MTJ cells disposed in a uniform array on said substrate, each MTJ cell having a top and sides and a horizontal cross-section of a given geometrical shape;
forming an insulating layer on said substrate, said insulating layer also covering the sides of said MTJ cells;
forming a patterned stabilized magnetic shield over the portion of said insulating layer on the substrate, said shield having a first patterned portion and a second patterned portion, wherein said first patterned portion conformally abuts and contacts at least a portion of the insulating layer on the side of each MTJ cell;
forming a second layer of insulation over said patterned stabilized magnetic shield, said second layer not contacting the tops of said MTJ cells; and wherein
both portions of said magnetic shield are electrically insulated from said substrate and from each MTJ cell; and wherein
each MTJ cell is magnetized in a first direction; and wherein
said first portion of the magnetic shield is magnetized in a second direction substantially orthogonal to the first direction; and wherein
each MTJ cell is magnetostatically coupled to said first portion of the magnetic shield; and wherein
said second portion of the magnetic shield stabilizes the magnetization of the first portion by a form of magnetic coupling.

73. The method of claim 72 wherein each said MTJ cell is shaped by a process comprising photolithography and ion-milling in which a photolithographic stencil of the required cell shape is first formed and said stencil is then used as an ion-milling mask to produce said geometric shape.

74. The method of claim 73 wherein both said portions of the magnetic shield are formed and patterned using a self-aligned process of photolithography wherein the photolithographic stencil used for forming the shield is the same photolitographic stencil used for shaping the MTJ cells.

75. The method of claim 73 wherein the horizontal cross-sectional shape of each cell has a long axis and a short axis, wherein said axes are mutually orthogonal and wherein said cells form rows of uniformly separated cells in which their major axes are co-linear and columns of uniformly separated cells in which their minor axes are co-linear and define, thereby, an orthogonal rectangular array whose first and second array axes extend co-linearly along said short and long axes respectively.

76. The method of claim 75 wherein said first portion is patterned to form continuous, substantially rectangular strips of equal length and width, whose upper and lower edges are co-linear along said second array axis and whose long edge is parallel to said first array axis, said strips being separated along the direction of said second array axis by substantially rectangular gaps also parallel to said first array axis, the mid-lines of said gaps passing through the centers of the MTJ cells aligned in columns along said first array axis and said gaps being narrower than the major axis of the cells so that horizontally disposed end portions of said cells extend into, are conformally surrounded by, but are electrically insulated from, separated portions of said shield disposed across the gap from each other and wherein said second portion of the shield is formed as two horizontal rectangular strips extending in the second array axis direction and contacting the upper and lower edges of said first portion of the shields.

77. The method of claim 76 wherein said first portion of the shield is further patterned by the formation of parallel, uniformly spaced gaps extending in the direction of said second array axis, the mid-line of said gaps passing midway between the centers of the MTJ cells aligned in rows along said first array axis and wherein said second portion of the shield further comprises rectangular strips of magnetic material formed within said gaps formed in the second array axis direction.

78. The method of claim 77 wherein said first portion of the shield is further patterned by the formation of a second set of parallel, uniformly spaced gaps extending in the direction of said first array axis, the mid-line of said second set of gaps passing midway between the centers of the MTJ cells aligned in columns along said first array axis and wherein said second portion of the shield further comprises rectangular strips of magnetic material formed within said second set of gaps formed in the first array axis direction.

79. The method of claim 75 wherein said first portion of the shield is patterned to form rectangular segments, the long sides of said segments being parallel to the first array axis and the short sides being parallel to the second array axis, the segments being formed by and their sides being bounded by continuous gaps extending in the direction of said first and second array axis, and wherein each rectangular segment contains at least one MTJ cell and wherein said second portion of the shield comprises strips of magnetic material formed in said gaps.

80. The method of claim 75 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

81. The method of claim 76 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

82. The method of claim 77 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

83. The method of claim 78 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of permanent magnetic material chosen from the group consisting of Co, CoCr, CoCrPt, CoPt, CoCrB, CoPtB, CoP or CoNiFe, said second portion stabilizing the magnetization of said first portion by magnetostatic coupling.

84. The method of claim 75 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

85. The method of claim 76 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

86. The method of claim 77 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

87. The method of claim 78 wherein said patterned first portion is formed of ferromagnetic material chosen from the group consisting of of CoFe, NiFe, CoNiFe, CoZrTa, CoFeB, CoZrTa, CoNbTa and CoHfTa and said patterned second portion is formed of antiferromagnetic material chosen from the group of such material consisting of PtMn, NiMn, IrMn, OsMn, PdPtMn, NiO, CoO or CoNiO, said second portion stabilizing the magnetization of said first portion by exchange coupling.

* * * * *